ETCHING OF CHROMIUM ALLOYS

Filed March 23, 1960

INVENTOR.
DOUGLAS C. WENDELL, JR
BY Henry W. Kaufmann
AGENT

United States Patent Office 3,108,931
Patented Oct. 29, 1963

3,108,931
ETCHING OF CHROMIUM ALLOYS

Douglas C. Wendell, Jr., Malvern, Pa., assignor to Burroughs Corporation, Detroit, Mich., a corporation of Michigan Filed Mar. 23, 1960, Ser. No. 17,201
3 Claims. (Cl. 204—15)

This invention pertains to improvements in the art of etching selected portions of ferrous alloys exhibiting corrosion resistance as a result of a content of chromium.

The art of producing relatively complex patterns of metal by etching is old. As a result of the need for rapid formation of patterns of electrical conductors in connection with electronic ordnance fuzes and, subsequently, in connection with the production of large complex electrical apparatus such as electronic computers and control devices, a specialized branch of this art known as that of etching circuits has developed within the past two decades. In broad outline, etched circuits are produced on a non-conductive base which is coated with a layer of electrically conductive material, frequently copper or a copper alloy. The surface of the metal is covered in those areas where the presence of the conductive material is desired, with a material insoluble in the etchant to be used, known as a resist. The entire surface of the conductive layer, both the bare portion and that covered by the resist, is exposed to the etchant, usually a liquid, and the action of the etchant is permitted to continue until the exposed conductive layer has been etched away, but that portion covered by the resist remains because the etchant has been kept from contact with the conductive metal at those areas. The surplus etchant is then removed, and, usually, the resist is removed by some means which does not damage the residual metal or the non-conductive base. The surviving metal forms the desired pattern of conductors on an electrically insulating base.

The resist is ordinarily provided initially in the form of a lacquer or similar material which may be applied in liquid form by a printing or stamping or similar operation to form the required pattern of resist on the unetched metal layer; or the resist may be a photosensitive material which is applied to the entire layer of unetched metal and is then exposed to a photographic pattern of light which renders insoluble those areas of the resist which it is desired to preserve. After exposure, the resist is subjected to the action of a solvent which removes the resist from those areas not rendered insoluble and leaves it in those areas which have been rendered insoluble by the action of the light.

It is clear from the preceding that it is essential to the successful operation of such a process that the resist remain firmly attached during the etching process to those areas of metal which it is desired to preserve from etching. The etchants employed with conventional copper or copper alloys, while they tend to undercut the metal slightly by attacking from the edge of the resist, do not impair the bond between the resist and the metal to any harmful extent.

For particular purposes, it is sometimes desired to employ as a conductive material, instead of copper, ferrous alloys which have been rendered corrosion-resistant by a content of chromium. Standard chrome-irons and stainless steels of this nature are well known, perhaps the commonest being known as "18–8" because of its content of 18 percent chromium and 8 percent nickel. It has been found that conventional etchants for such alloys attack the bond between the resist and the alloy to such an extent that the mechanical agitation incidental to the operation of a splash etcher, which continually splashes etching liquid over the surfaces to be treated, causes partial if not complete separation of the resist from the alloy, ruining the resulting product.

The corrosion resistance of chromium-bearing ferrous alloys is generally believed to be caused by the rapid production by atmospheric oxygen or other agents of a very thin layer of chromium oxide on the surface of the alloy. This oxide is impervious to many agents, and produces, by its protective action, the commonly observed corrosion resistance or "stainlessness" of such alloys. However, the chromium oxide layer is readily soluble in solutions used to etch such alloys. The conventional resists employed in such etching may be slightly permeable to the etchant liquids, or the etchant liquids may creep in from the resist boundary. There is also some reason to suspect that the presence of surface contaminants impairs the bond between the resist and the base metal, quite apart from the effect of chromium oxide, since it has been found that treatment of stainless steel with good organic solvents can sometimes, but not consistently, produce good adherence between stainless steel and the resist. In any event, it is an observed fact that the use of conventional etchant resists for the production by chemical etching of fine patterns of ferrous alloys containing chromium, such as stainless steels and irons, is hampered and frequently rendered impossible by the complete detachment of the resist from those areas which it is intended to protect. My invention teaches a procedure for overcoming this difficulty, reliably, conveniently, and simply.

I have found that a firm bond between the chromium-bearing alloy and the resist may be maintained throughout the etching process by immersing the alloy in a plating solution, e.g. a nickel-plating bath, in an electrolytic cell, first making the alloy the anode so that the surface of the alloy is lightly etched sufficiently to remove at least a large proportion of the surface oxide coating, and then making the alloy the cathode so that a light coating of nickel is electrodeposited upon it. The resist is then bonded to selected areas of the surface of the plating, and the etching process is carried out in the conventional manner; and I have observed that the resist remains firmly attached throughout the etching process.

The usefulness of my invention is particularly great in connection with the etching of very fine patterns involving the production of metal lines of very narrow width; for, in the production of such patterns by etching, the width of the resist strips covering the desired narrow strip of metal is so slight that very slight penetration, in terms of distance, of the etchant under the resist suffices for complete removal of the resist.

Thus an important object of my invention is to permit the etching of patterns to produce very narrow strips of chromiferous ferrous alloys.

Another important object of my invention is to improve the bond between a chromium-bearing alloy and a resist to etchants.

Other objects of my invention will appear in the course of the following detailed specification and explanation.

For the better understanding of my invention I provide figures of drawings, as follows.

Figure 1:
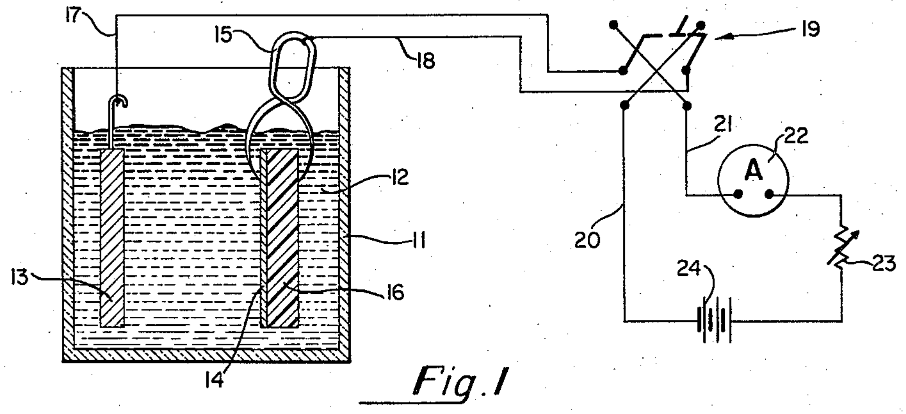
FIGURE 1 represents an electroplating bath and its auxiliaries, and a chrome-bearing ferrous alloy surface being treated according to my invention.

FIGURE 1 represents a container 11 partially filled with electrolyte 12 in which there are immersed an electrode 13, preferably well adapted to serve as an anode for the deposition of nickel, and a layer 14 of stainless steel attached to a non-conducting insoluble base support 16. Electrode 13 is connected by conductor 17 to one pole of a reversing switch 19, and layer 14 is connected by clip 15 and conductor 18 to the other pole of reversing switch 19. A current source 24 is connected in series with an adjustable resistor 23 and an ammeter 22; and this series combination is connected by conductors 20 and 21 to the terminals of reversing switch 19.

The mode of operation is as follows: After the layer 14 has been immersed in electrolyte 12, the switch 19 is thrown to the "down" position, which will make layer 14 positive and electrode 13 negative. Resistor 23 may be adjusted to provide a value of current suitable for etching, which may be read on meter 22. After a sufficient electroetching period has passed, switch 19 is thrown to the "up" position, which will make layer 14 negative and electrode 13 positive. Resistor 23 may be adjusted to give a current suitable for plating, as determined by reference to meter 22. After a suitable thickness of nickel has been deposited on the stainless steel layer 14, switch 19 is opened and the layer 14, plated with nickel on its exposed surface, and attached by its other surface to support 16, is removed from the bath and excess electrolyte is rinsed off. The plated surface is dried; resist is applied, a desired resist pattern is formed, and the then exposed parts of layer 14 are etched away according to the known art.

A formulation and suitable conditions for electroetching and plating with nickel are the following.

Electrolyte 12 has the composition:

| | |
|---|---|
| Nickel chloride, $NiCl_2.6H_2O$ | 170 grams per liter. |
| Nickel sulphate, $NiSo_4.7H_2O$ | 190 grams per liter. |
| Boric acid, $H_3BO_3$ | 40 grams per liter. |
| Sodium lauryl sulphate | 4 milligrams per liter. |
| Hydrochloric acid, concentrated | 15 milliliters per liter. |
| Water solvent. | |

Electroetching is accomplished at a current density of 4 amperes per square decimeter at an electrolyte temperature of approximately seventy degrees Fahrenheit for 45 seconds.

Electroplating is accomplished at a current density of 4 amperes per square decimeter at an electrolyte temperature of approximately seventy degrees Fahrenheit for ten minutes.

A suitable etchant solution for etching a chromium-containing ferrous alloy electroetched and electroplated as hereinabove described is an aqueous solution of ferric chloride of concentration producing a density of 42 degrees Baumé.

The preceding description has specifically described the use of nickel as the preferred way of practicing my invention. Nickel is highly desirable because its plating is well understood, necessary auxiliaries such as nickel anodes are common commercial items, and it produces a completely satisfactory result. However, economic or other factors may alter the relative desirability of nickel; it is, for example, more valuable and strategically more critical than iron. Therefore, in general terms, the method of practicing my invention which I have described by reference to FIGURE 1 applies to the use of a metal having the following characteristics:

(*a*) It can be electrodeposited from a bath which may also be employed for electroetching the chromium-bearing alloy 14;

(*b*) It is etchable by an etchant suitable for etching the chromium-bearing alloy;

(*c*) Its deposition will not be impaired by a moderate contamination of the plating bath by the constituents of the chromium-bearing alloy, as a result of the electroetching operation.

It is apparent that requirement (*a*) may be evaded by etching the surface of alloy layer 14 in a first bath, and then transferring the etched piece to a second bath for plating. The advantages of this under ordinary circumstances appear dubious, although justifying circumstances are conceivable. Similarly it is conceivable, but probably generally unprofitable, to first etch the plated material from the exposed surface of alloy 14 by an etchant adapted to etch only the plated metal, and then to transfer the work to a second bath of etchant adapted to etch alloy 14. These stratagems, while interesting technical feats and possibly of value in special cases, cannot properly be considered as representative of generally preferred ways of practicing my invention. Similarly, requirement (*c*) is practical rather than ideal; it is obviously possible to discard electrolyte 12 and replace it with fresh electrolyte after only very slight contamination has occurred.

Metals which meet the criteria (*a*), (*b*), and (*c*) above enumerated include iron, iron-nickel alloys, and cobalt; i.e. members of the iron groups. Baths suitable for their use have the following composition and operating conditions:

(I)

| | |
|---|---|
| Nickel chloride, $NiCl_2.6H_2O$ | 180 grams per liter. |
| Ferrous chloride, $FeCl_2.4H_2O$ | 45 grams per liter. |
| Hydrochloric acid, concentrated | 75 milliliters per liter. |
| Water solvent. | |

Temperature, 20 degrees centigrade.
Etch 1 minute at 3 amperes per square decimeter.
Plate 10 minutes at 3 amperes per square decimeter.
Deposit: Nickel-iron.

(II)

| | |
|---|---|
| Ferrous sulphate, $FeSO_4.7H_2O$ | 150 grams per liter. |
| Ferrous chloride, $FeCl_2.4H_2O$ | 75 grams per liter. |
| Ammonium chloride, $NH_4Cl$ | 100 grams per liter. |
| Hydrochloric acid, concentrated | 25 milliliters per liter. |
| Water solvent. | |

Temperature, 50 degrees centigrade.
Etch 1 minute at 3 amperes per square decimeter.
Plate 10 minutes at 3 amperes per square decimeter.
Deposit: Iron.

(III)

| | |
|---|---|
| Cobaltous sulphate, $CoSO_4.7H_2O$ | 150 grams per liter. |
| Cobaltous chloride, $CoCl_2.6H_2O$ | 75 grams per liter. |
| Ammonium chloride, $NH_4Cl$ | 100 grams per liter. |
| Hydrochloric acid, concentrated | 25 milliliters per liter. |
| Water solvent. | |

Temperature, 50 degrees centigrade.
Etch 1 minute at 3 amperes per square decimeter.
Plate 10 minutes at 3 amperes per square decimeter.
Deposit: Cobalt.

(IV)

| | |
|---|---|
| Nickelous sulphate, $NiSO_4.7H_2O$ | 100 grams per liter. |
| Cobaltous chloride, $CoCl_2.6H_2O$ | 80 grams per liter. |
| Ammonium chloride, $NH_4Cl$ | 100 grams per liter. |
| Hydrochloric acid, concentrated | 25 milliliters per liter. |
| Water solvent. | |

Temperature, 50 degrees centigrade.
Etch 1 minute at 3 amperes per square decimeter.
Plate 10 minutes at 3 amperes per square decimeter.
Deposit: Nickel-cobalt.

Zinc is also useful, and may be deposited from the following bath:

(V)

| | |
|---|---|
| Zinc sulphate, $ZnSO_4.6H_2O$ | 150 grams per liter. |
| Zinc chloride, $ZnCl_2$ | 75 grams per liter. |
| Ammonium chloride, $NH_4Cl$ | 25 grams per liter. |
| Hydrochloric acid, concentrated | 15 milliliters per liter. |

Water solvent.
Temperature, 40 degrees centigrade.
Etch 1 minute at 3 amperes per square decimeter.
Plate 10 minutes at 3 amperes per square decimeter.
Deposit: Zinc.

If different baths are to be used for etching and for plating, the apparatus represented in FIGURE 1 may be employed as previously herein described, with the sole modification that the electrolyte 12 there represented will be initially of a composition suitable for etching the alloy 14; and after completion of the etching operation, this first electrolyte will be replaced by another electrolyte suitable for the electrodeposition of the metal to be plated upon alloy 14.

Figure 2:
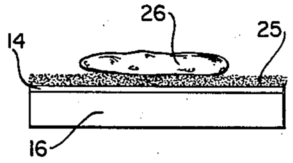
FIGURE 2 represents a metal surface covered with chromium oxide, and having a resist superposed thereon.
Figure 3:
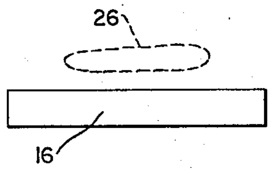
FIGURE 3 represents the result of etching the object represented in FIGURE 2.

By way of further elucidation of the results produced by the prior art and by the practice of my invention, FIGURE 2 represents a layer of alloy 14 upon a nonconductive insoluble base 16; the exposed surface of alloy 14 is shown covered with a thin layer of chromium oxide and contaminations as indicated at 25, and a portion of resist 26 is shown attached to the surface layer 25; this is the result believed to be obtained by practice of the prior art. Immersion of the specimen represented in FIGURE 2 in an etchant produces the result represented in FIGURE 3, where only the insoluble base 16 remains, the resist 26 having been undercut and carried away by the etchant, its former location being shown by a dashed line.

Figure 4:
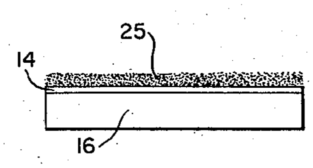
FIGURE 4 represents a metal surface covered with chromium oxide, the metal being laminated against a non-metallic base.
Figure 5:
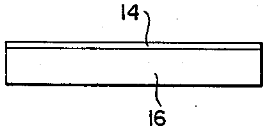
FIGURE 5 represents the same object as FIGURE 4, with the chromium oxide removed, as by electrolysis.
Figure 6:
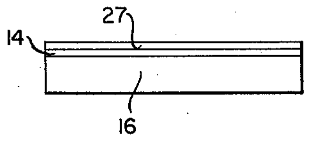
FIGURE 6 represents the same object as FIGURE 5, but with a layer of electrodeposited metal protecting the chromium-bearing metal.
Figure 7:
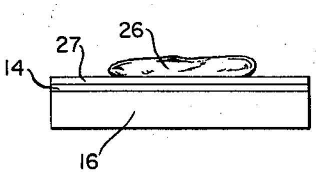
FIGURE 7 represents the same object as FIGURE 6, but with a resist superposed thereon.
Figure 8:
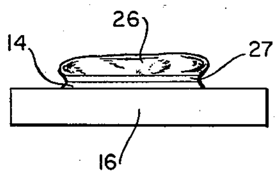
FIGURE 8 represents the same object as FIGURE 7, but after the etching process has been performed.

FIGURE 4 represents a sample of alloy 14 laminated to base 16, and having its upper surface covered with oxide and other contamination 25. FIGURE 5 represents the piece of FIGURE 4 after the layer 25 has been removed by electroetching, according to my invention. FIGURE 6 represents the piece of FIGURE 5, but with a layer of plated metal 27 upon the upper surface of alloy 14, in accordance with my invention. FIGURE 7 represents the piece of FIGURE 6, with a portion of resist 26 upon the plated layer 27, in accordance with my invention. FIGURE 8 represents the piece of FIGURE 7 after exposure to an etchant which is capable of etching both the plated layer 27 and the base alloy 14; it is clearly represented how the resist 26 remains firmly attached to the surface of plated layer 27, and the etchant undercuts resist 26 only slightly, leaving sharply etched boundaries on the residual base alloy 14.

The art of electroplating is old and well known. General references on etching and plating and particular formulas for plating specific metals on particular surfaces may be found in the Metal Finishing Guidebook Directory, published by Metals and Plastics Publications, Incorporated, of 381 Broadway, Westwood, New Jersey.

Obviously many modifications and variations of the present invention are possible in the light of the above teachings. It is, therefore, to be understood that within the scope of the appended claims the invention may be practiced other than as specifically described and illustrated.

What is claimed is:

1. The process of forming a predetermined pattern of electrical conductors on an electrical insulating member which comprises the steps of forming a layer of a ferrous alloy containing sufficient chromium to render the alloy stainless over the entire surface portion of the member, subjecting the exposed surface of the layer of the ferrous alloy to an anodic acid electroetching action to remove oxides and other impurities from said exposed surface to provide an etched surface, electroplating said etched surface of the ferrous alloy with a coating selected from the class: nickel, iron, cobalt, zinc, nickel-iron and nickel-cobalt to provide an electroplated coating, forming on discrete portions of the exposed surface of said electroplated coating an etchant resist composition which coincides with said predetermined pattern of electrical conductors to provide a resist composition bearing surface, and applying to said resist-composition-bearing surface an etchant for removing all of the electroplated coating and ferrous alloy not underlying the said predetermined pattern of resist composition.

2. The process of preparing a pattern of fine electrical conductors on an electrical insulating member which comprises the steps of forming a layer of a ferrous alloy containing sufficient chromium to render the alloy stainless over the entire surface portion of the member, said ferrous alloy selected from the class including 18–8 chromium nickel ferrous alloy, lightly etching the exposed surface of the layer of ferrous alloy sufficiently to remove oxides and other impurities therefrom to provide an etched surface, lightly plating said etched surface of the ferrous alloy with a coating of metal selected from the class: nickel, iron, cobalt, zinc, nickel-iron and nickel-cobalt, bonding on discrete portions of the exposed surface of the plated coating a predetermined pattern of etchant resist composition which coincides with the desired predetermined pattern of electrical conductors to provide a resist composition bearing surface, and applying to said resist-composition-bearing surface an etchant for removing all of the plated coating and ferrous alloy not underlying the predetermined pattern of resist composition.

3. The process of forming electrical conductors of 18–8 chromium-nickel steel in predetermined pattern on an electrically insulating member which comprises: providing a layer of chromium-nickel over the entire surface portion of the member to provide an exposed surface, subjecting said exposed surface layer of said steel to a light etching action sufficient to remove oxides and other impurities from the said exposed surface to provide an etched surface, plating the entire etched surface of the steel with a coating of metal selected from the class: nickel, iron, cobalt, zinc, nickel-iron and nickel-cobalt to provide a coated surface, forming on said coated surface a pattern of etchant-resist composition which coincides with the said predetermined pattern of electrical conductors to be formed, to provide a resist-composition-bearing surface, and applying to said resist-composition-bearing surface an etchant for removing all of the plated coating and steel not underlying said predetermined pattern of resist composition.

References Cited in the file of this patent

UNITED STATES PATENTS

| | | |
|---|---|---|
| 1,954,473 | Dunn | Apr. 10, 1934 |
| 2,491,126 | McGill | Dec. 13, 1949 |
| 2,647,864 | Goffredo | Aug. 4, 1953 |
| 2,666,008 | Enslein et al. | Jan. 12, 1954 |
| 2,915,444 | Meyer | Dec. 1, 1959 |

FOREIGN PATENTS

| | | |
|---|---|---|
| 815,572 | Great Britain | July 1, 1959 |